(12) United States Patent
Le Briz et al.

(10) Patent No.: US 7,701,047 B2
(45) Date of Patent: Apr. 20, 2010

(54) INTEGRATED-CIRCUIT CHIP WITH OFFSET EXTERNAL PADS AND METHOD FOR FABRICATING SUCH A CHIP

(75) Inventors: Olivier Le Briz, Saint-Gervais (FR); Sébastien Marsanne, Meylan (FR); Laurence Martin, Grenoble (FR); Guiseppe Croce, Monticello Brianza (IT)

(73) Assignees: STMicroelectronics S.A., Montrouge (FR); STMicroelectronics S.r.l., Agrate Brianza (IT)

( * ) Notice: Subject to any disclaimer, the term of this patent is extended or adjusted under 35 U.S.C. 154(b) by 461 days.

(21) Appl. No.: 11/726,353

(22) Filed: Mar. 19, 2007

(65) Prior Publication Data

US 2007/0228508 A1    Oct. 4, 2007

(30) Foreign Application Priority Data

Mar. 21, 2006   (FR)   ................................. 06 02469

(51) Int. Cl.
*H01L 23/48* (2006.01)
*H05K 3/40* (2006.01)
(52) U.S. Cl. .................... 257/690; 257/774; 438/622
(58) Field of Classification Search ............. 257/690, 257/774, 776; 438/622
See application file for complete search history.

(56) References Cited

U.S. PATENT DOCUMENTS

| 3,461,357 | A | 8/1969 | Mutter et al. | |
| 6,078,100 | A | 6/2000 | Duesman et al. | |
| 6,756,683 | B2* | 6/2004 | Kunihisa et al. | 257/778 |
| 7,224,046 | B2* | 5/2007 | Abe et al. | 257/668 |
| 7,224,069 | B2* | 5/2007 | Chen | 257/774 |
| 7,372,161 | B2* | 5/2008 | Lin et al. | 257/773 |
| 2006/0076687 | A1* | 4/2006 | Lin et al. | 257/773 |

FOREIGN PATENT DOCUMENTS

WO   WO-02/03461 A2   1/2002

OTHER PUBLICATIONS

Preliminary French Search Report, FR 06 02469, dated Nov. 29, 2006.

* cited by examiner

*Primary Examiner*—Fernando L Toledo
(74) *Attorney, Agent, or Firm*—Gardere Wynne Sewell LLP

(57) ABSTRACT

An integrated-circuit chip includes a first electrical connection are placed on an underlying layer and covered with an intermediate dielectric layer. A second electrical connection is placed on the intermediate dielectric layer and is covered with a superficial dielectric layer. External electrical connection pads are placed on the superficial dielectric layer and extend selectively over the first electrical connection. Vias pass through the superficial dielectric layer and the intermediate dielectric layer to make connection between the first electrical connection and the external electrical connection pads.

19 Claims, 2 Drawing Sheets

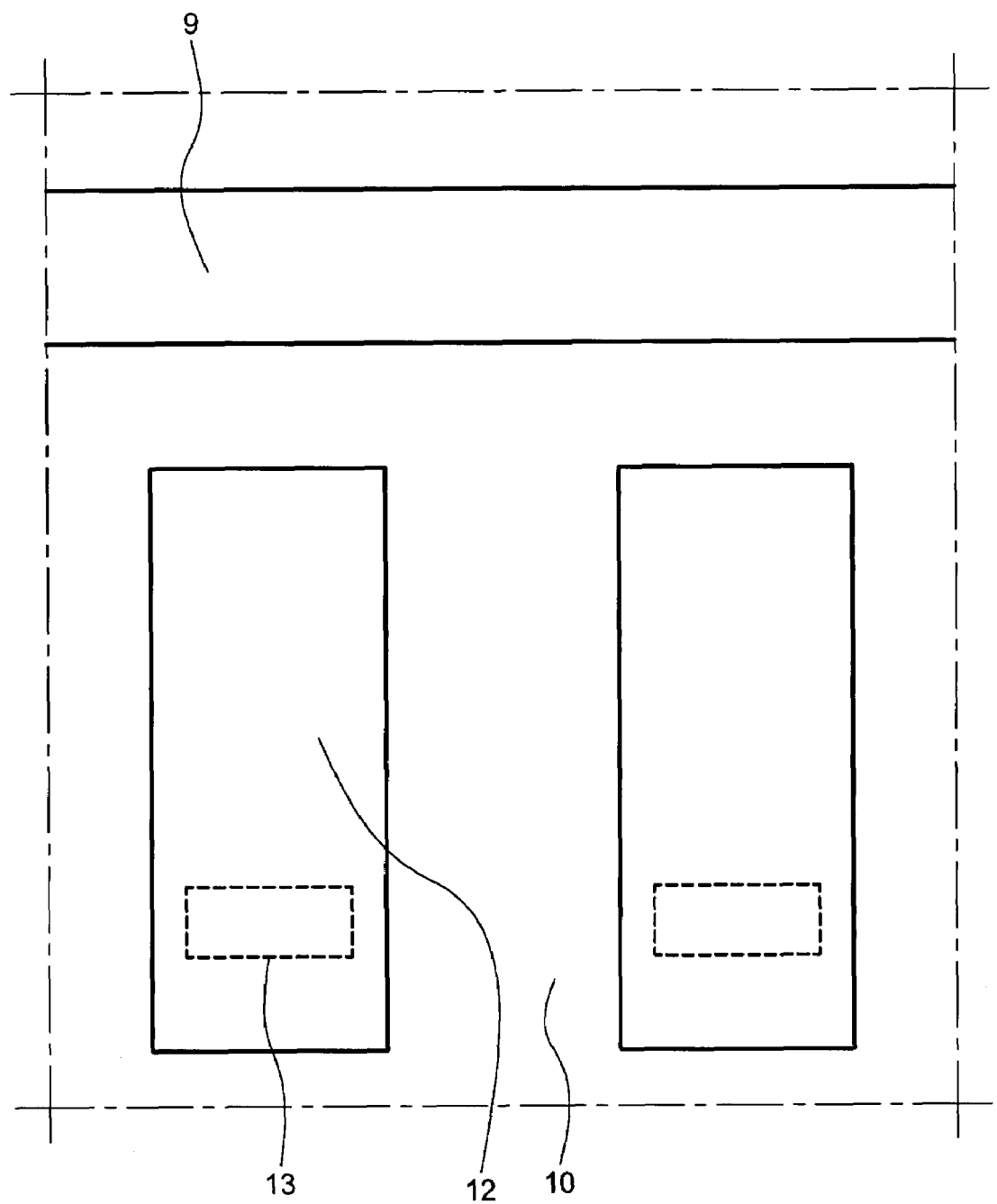

INTEGRATED-CIRCUIT CHIP WITH OFFSET EXTERNAL PADS AND METHOD FOR FABRICATING SUCH A CHIP

PRIORITY CLAIM

The present application claims priority from French Application for Patent No. 06 02469 filed Mar. 21, 2006, the disclosure of which is hereby incorporated by reference.

BACKGROUND OF THE INVENTION

1. Technical Field of the Invention

The present invention relates to the general field semiconductor devices and, more particularly, to integrated-circuit chips equipped with projecting external electrical contact pads.

In one application, such chips are intended to be mounted on boards so that their external contact pads establish electrical connections on these boards. To this end, during assembly, the chips are pressed in the direction of boards provided with a dielectric layer having particles of an electrically conductive material in suspension, so that the particles lying between the boards and the end or front faces of the external contact pads establish the electrical connections.

In another application, such external contact pads are intended to be soldered to the end of overhanging electrical connection tracks carried by flexible strips. In order to carry out such assembly, the electrical connection track ends are pressed onto the upper face of the contact pads of the chips, at a relatively high temperature.

2. Description of Related Art

Currently, based on a chip comprising a lower layer on which internal pads are formed and a superficial layer which covers the latter and which has surface bumps in the zones of these internal pads, openings are produced in the superficial layer above the internal pads, and the external and projecting contact pads are produced by growth deposition of an electrically conductive material in the openings of the superficial layer and the openings of a temporary mask, which are larger than the openings of the superficial layer. The result is that the end faces of the external contact pads which are obtained have a hollowed central part and a peripheral rim corresponding to the rim of the superficial layer enclosing the corresponding opening made in this layer.

Such an arrangement causes weakening of the superficial layer around the external contact pads and a risk of cracks appearing during the aforementioned assembly operations, which need to be carried out at a relatively high pressure particularly because of the existence of the hollowed parts, these cracks being conducive to the appearance of internal corrosion of the chip. Furthermore, since the internal pads are generally made of aluminum and the external contact pads are generally made of gold, there is a risk of electrochemical reactions which, by expanding the material, are liable to damage the electrical connections and further increase the risk of cracks appearing.

There is a need in the art to improve the mechanical strength of integrated-circuit chips with projecting external contact pads, in respect of both pressure and temperature, particularly during the operations of connecting the pads to other connection means.

SUMMARY OF THE INVENTION

The present invention firstly relates to an integrated-circuit chip.

According to the invention, this chip comprises: first electrical connection means placed on an underlying layer and covered with an intermediate dielectric layer; second electrical connection means placed on the intermediate dielectric layer and covered with a superficial dielectric layer; external electrical connection pads placed on the superficial dielectric layer, extending selectively over at least one of the first electrical connection means; and vias passing through the superficial dielectric layer and the intermediate dielectric layer and placed between the first electrical connection means and the external electrical connection pads.

According to the invention, the electrical connection pads are preferably produced on flat zones of the superficial dielectric layer.

According to the invention, the chip further comprises auxiliary electrical connection means on the underlying layer, passing under the electrical connection pads.

The present invention also relates to a method for fabricating an integrated-circuit chip.

This method comprises: producing first electrical connection means on an underlying layer; producing an intermediate dielectric layer on the underlying layer that covers the first electrical connection means; producing second electrical connection means on the intermediate dielectric layer; producing a superficial dielectric layer on the intermediate dielectric layer that covers the second electrical connection means; producing holes passing through the superficial dielectric layer and the intermediate dielectric layer which selectively uncover zones of the first electrical connection means; and producing electrical connection vias in the holes which form electrical connection pads extending over the vias on the superficial dielectric layer.

According to the invention, after having produced the holes, the method may advantageously comprise producing a mask having holes corresponding to the pads to be obtained on the superficial dielectric layer, and producing the electrical connection vias and the electrical connection pads by a metal growth deposition operation.

According to the invention, the method may advantageously comprise producing the electrical connection pads on flat zones of the superficial dielectric layer.

In an embodiment, an integrated circuit chip comprises: a first electrical connection formed in a first dielectric layer; a second electrical connection, offset from the first electrical connection, formed in a second dielectric layer overlying the first dielectric layer, the second dielectric layer having a flat surface region located above the first electrical connection; a electrical connection pad formed on the flat surface region of the second dielectric layer; and a via interconnecting the electrical connection pad and the first electrical connection, the via passing through aligned openings formed in the first and second dielectric layers.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 3 represents a partial plan view of the chip in FIG. 1.

DETAILED DESCRIPTION OF THE PREFERRED EMBODIMENTS

Figure 1:
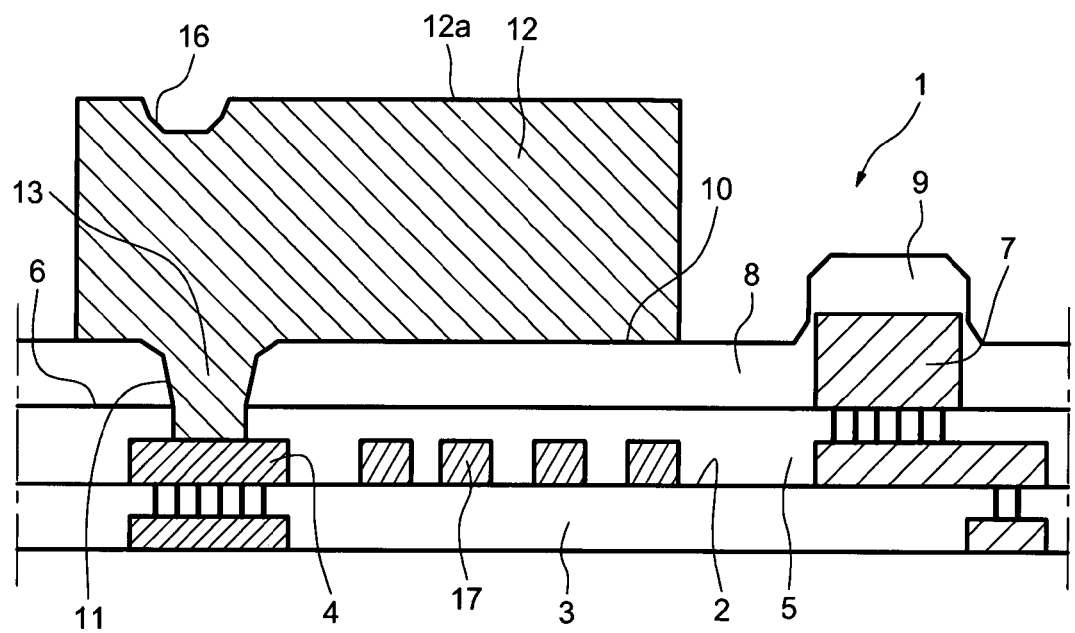
FIG. 1 represents a partial section of an integrated-circuit chip according to the invention.

Referring to FIGS. 1 and 3, it can be seen that an integrated-circuit chip 1 has been represented which, on the planarized surface 2 of an underlying layer 3 below which integrated electronic circuits or components are produced, comprises first electrical connection means comprising buried pads or tracks 4, and an intermediate dielectric layer 5 formed on the surface 2 of the underlying layer 3 and covering the buried pads or tracks 4.

On the planarized surface 6 of the intermediate dielectric layer 5, the chip 1 comprises second electrical connection means comprising buried pads or tracks 7, and a superficial dielectric layer 8 formed on the surface 6 of the intermediate dielectric layer 5 and covering the buried pads or tracks 7. The superficial dielectric layer 8 has bumps 9 enclosing the buried pads or tracks 7 from above.

The buried pads or tracks 4 are offset horizontally relative to the bumps 9, so that the external surface of the superficial dielectric layer 8 has flat zones 10 extending over the buried pads or tracks 4, laterally to the bumps 9.

The superficial dielectric layer 8 has holes or openings 11 which are formed through the intermediate dielectric layer 5 and the superficial dielectric layer 8 and which, respectively, partially uncover the buried pads or tracks 4.

The chip 1 further comprises projecting external electrical connection or contact pads 12 which are formed on the flat zones 10 and pass over the holes 11 while covering them completely, and which are vertically connected respectively to the buried pads or tracks 4 via electrical connection vias 13, these vias extending between the buried pads or tracks 4 and the external electrical connection pads 12.

The external electrical connection pads 12 are in the form of parallelepipedal blocks whose upper face is flat over almost its entire surface.

In the variant represented, the external electrical connection pads 12 are elongate and the vias are elongated transversely to these pads 12, without reaching their long sides. Advantageously, the length of the external electrical connection pads 12 is much greater than the width of the electrical connection vias 13.

Figure 2:
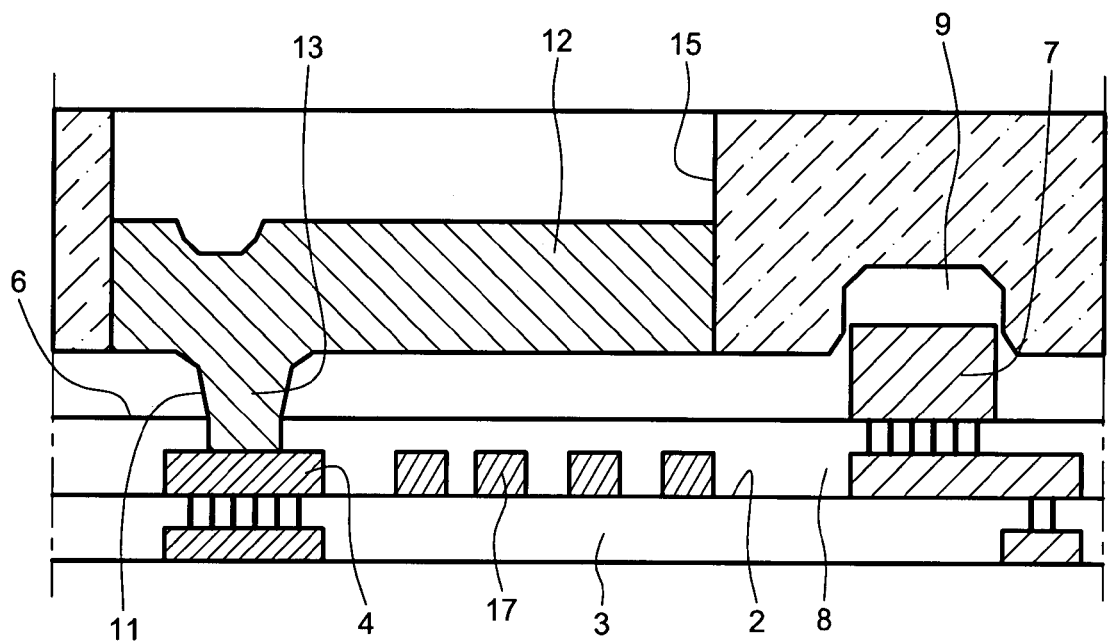
FIG. 2 represents the chip of FIG. 1 in a subsequent fabrication step.

In order to fabricate the chip 1 which has just been described, the following procedure may be adopted as illustrated in FIG. 2, using the operating methods which are known in the field of microelectronics.

Starting with a chip 1 fabricated as far as the superficial dielectric layer 8, the holes 11 are produced for example by etching, these holes being slightly convergent in the direction of the buried pads or tracks 4.

A thin layer (UBM) of one or more materials promoting creation of the pads 12 and the vias 13, this layer not being visible in the drawing, is then deposited on the surface of the superficial dielectric layer 8.

A mask 14, in which openings 15 are produced corresponding to the external pads to be produced, is subsequently formed on the superficial dielectric layer 8.

The electrical connection pads 12 and the electrical connection vias 13 are then produced by a single growth deposition operation of a selected metal.

Lastly, the mask 14 and the thin layer (UBM) are removed from the surface of the superficial dielectric layer 8, all around the electrical connection pads 12.

The structure of the chip 1 which has just been described has in particular the following advantages.

The electrical connection pads 12 have flat front faces 12a, except for slightly hollowed parts 16 lying above the vias 13, these hollowed parts 16 being very small relative to the total surface of the front faces 12a. The flat front faces 12a are thus conducive to all flat connections on these faces, without entailing difficulties.

The electrical connection pads 12 are formed on a structure of stacked horizontal layers and on a flat zone 10. Such a structure is thus capable of experiencing relatively large pressures exerted on their front faces 12a, in particular when placing connections on the latter, without causing damage.

The electrical connection pads 12 and the buried pads or tracks 7, produced in a metallic level higher than that of the buried pads or tracks 4 connected to these pads 12, are structurally independent. The cross section and, in particular, the thickness of the buried pads or tracks 7 of the last metallic level may thus be selected independently and therefore only as a function of the associated electrical requirements.

Moreover, electrical connection tracks 17 passing below the electrical connection pads 12 may be produced on the underlying layer 3 and used for connection requirements inside the chips.

In a particular example, the buried pads or tracks 4 may be made of aluminum (Al), the thin layer (UBM) may be made of titanium/tungsten (TiW) covered with gold powder (Au) and the electrical connection pads 12 and the electrical connection vias 13 may be made of gold (Au). Of course, metals other than those mentioned above could be used.

Also by way of example, the thickness of the buried pads or tracks 4 may lie between 0.5 and 0.9 microns, the thickness of the intermediate layer 5 above these pads or tracks 4 may lie between 0.6 and 0.8 microns, the thickness of the superficial layer 8 may lie between 0.8 and 1.2 microns and the surface covered by the external connection pads may be from 5 to 15 times greater than the surface covered by the electrical connection vias 13, which latter surface may lie between 100 and 200 square microns. Moreover, the thickness of the buried pads or tracks 7 may lie between 0.8 and 3 microns.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit chip, comprising:
   first electrical connection means placed on a top surface of an underlying layer and covered with an intermediate dielectric layer;
   second electrical connection means placed on a top surface of the intermediate dielectric layer and covered with a superficial dielectric layer;
   an external electrical connection pad placed on a top surface of the superficial dielectric layer and extending selectively over at least one of the first electrical connection means; and
   a via passing through both the superficial dielectric layer and the intermediate dielectric layer to interconnect the first electrical connection means and the external electrical connection pad.

2. The integrated circuit chip according to claim 1, wherein the electrical connection pads are produced on flat zones of the superficial dielectric layer.

3. The integrated circuit chip according to claim 1, further comprising auxiliary electrical connection means on the underlying layer which pass under the electrical connection pads.

4. A method for fabricating an integrated-circuit chip, comprising:
   producing first electrical connection means on a top surface of an underlying layer;

producing an intermediate dielectric layer on a top surface of the underlying layer which covers the first electrical connection means;

producing second electrical connection means on a top surface of the intermediate dielectric layer;

producing a superficial dielectric layer on a top surface of the intermediate dielectric layer which covers the second electrical connection means;

producing a hole passing through both the superficial dielectric layer and the intermediate dielectric layer which selectively uncovers a zone of the first electrical connection means; and producing an electrical connection via in the hole and forming an electrical connection pad extending over the via on a top surface of the superficial dielectric layer.

5. The method according to claim 4, further comprising, after having produced the holes:

producing a mask having holes corresponding to the pads to be obtained on the superficial dielectric layer, and producing the electrical connection vias and the electrical connection pads by a metal growth deposition operation.

6. The method according to claim 5, wherein producing the electrical connection pads comprises producing the pads on flat zones of the superficial dielectric layer.

7. An integrated circuit chip, comprising:

a first electrical connection formed in a first dielectric layer;

a second electrical connection, offset from the first electrical connection, formed in a second dielectric layer overlying the first dielectric layer, the second dielectric layer having a flat surface region located above the first electrical connection;

a electrical connection pad formed on the flat surface region of the second dielectric layer; and a via interconnecting the electrical connection pad and the first electrical connection, the via passing through aligned openings formed in the first and second dielectric layers.

8. The integrated circuit chip of claim 7, wherein the second dielectric layer has a bump surface region associated with a location of the second electrical connection, that bump surface region being offset from an extent of the electrical connection pad.

9. The integrated circuit chip of claim 7 wherein a thickness of the first electrical connection is between 0.5 and 0.9 microns and a thickness of the first dielectric layer above the first electrical connection is between 0.6 and 0.8 microns.

10. The integrated circuit chip of claim 9 wherein a thickness of the second dielectric layer is between 0.8 and 1.2 microns.

11. The integrated circuit chip of claim 7 wherein the electrical connection pad and via are an integral structure.

12. The integrated circuit chip of claim 11 wherein the integral structure is a single growth metal structure.

13. The integrated circuit chip of claim 12 wherein the metal structure is formed of gold.

14. The integrated circuit chip according to claim 1, wherein the superficial dielectric layer covers the second electrical connection means in a conformal manner.

15. The integrated circuit chip according to claim 1, wherein the external electrical connection pad has a substantially flat upper surface except for a depression formed in vertical alignment with the via.

16. The method according to claim 4, wherein producing the superficial dielectric layer comprises depositing the superficial dielectric layer to cover the second electrical connection means in a conformal manner.

17. The method according to claim 4, wherein forming the electrical connection pad comprises forming a substantially flat upper surface except for a depression formed in vertical alignment with the via.

18. The integrated circuit chip according to claim 7, wherein the second dielectric layer covers the second electrical connection in a conformal manner.

19. The integrated circuit chip according to claim 7, wherein the electrical connection pad has a substantially flat upper surface except for a depression formed in vertical alignment with the via.

* * * * *